United States Patent
Hayashi

(10) Patent No.: US 9,093,603 B2
(45) Date of Patent: Jul. 28, 2015

(54) LED ARRAY

(71) Applicant: STANLEY ELECTRIC CO., LTD., Meguro-ku, Tokyo (JP)

(72) Inventor: Takako Hayashi, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 156 days.

(21) Appl. No.: 14/029,674

(22) Filed: Sep. 17, 2013

(65) Prior Publication Data

US 2014/0077155 A1    Mar. 20, 2014

(30) Foreign Application Priority Data

Sep. 18, 2012  (JP) ................................ 2012-204631

(51) Int. Cl.
| | | |
|---|---|---|
| H01L 33/00 | (2010.01) |
| H01L 27/15 | (2006.01) |
| H01L 33/24 | (2010.01) |
| H01L 27/32 | (2006.01) |
| H01L 25/075 | (2006.01) |
| H01L 33/08 | (2010.01) |
| H01L 33/20 | (2010.01) |

(52) U.S. Cl.
CPC ............ *H01L 33/24* (2013.01); *H01L 25/0753* (2013.01); *H01L 27/156* (2013.01); *H01L 27/3204* (2013.01); *H01L 33/08* (2013.01); *H01L 33/20* (2013.01); *H01L 27/153* (2013.01); *H01L 33/0079* (2013.01)

(58) Field of Classification Search
CPC . H01L 25/0753; H01L 27/153; H01L 27/156; H01L 27/3204

USPC ............................. 257/88, 91, 93; 438/28, 34
See application file for complete search history.

(56) References Cited

U.S. PATENT DOCUMENTS

| | | | |
|---|---|---|---|
| 7,932,523 B2 | 4/2011 | Yatsuda et al. | |
| 2005/0225973 A1* | 10/2005 | Eliashevich et al. | 362/217 |
| 2007/0278502 A1 | 12/2007 | Shakuda et al. | |
| 2012/0161167 A1* | 6/2012 | Yamazaki | 257/88 |
| 2012/0223342 A1* | 9/2012 | Tanada et al. | 257/88 |
| 2013/0050653 A1* | 2/2013 | Miyachi et al. | 353/13 |
| 2013/0056757 A1* | 3/2013 | Miyachi et al. | 257/88 |
| 2013/0258895 A1* | 10/2013 | Kim et al. | 370/252 |
| 2014/0070254 A1* | 3/2014 | Akagi | 257/98 |
| 2014/0145222 A1* | 5/2014 | Yang et al. | 257/93 |

FOREIGN PATENT DOCUMENTS

| | | |
|---|---|---|
| JP | 2006-048934 A | 2/2006 |
| JP | 2006-080442 A | 3/2006 |

* cited by examiner

*Primary Examiner* — Marvin Payen
*Assistant Examiner* — Jeremy Joy
(74) *Attorney, Agent, or Firm* — Holtz, Holtz, Goodman & Chick PC

(57) ABSTRACT

An LED array includes a substrate and a semiconductor structure layer provided on the substrate. The semiconductor structure layer includes a first semiconductor layer, an active layer formed on the first semiconductor layer, and a second semiconductor layer formed on the active layer. The semiconductor structure layer is partitioned into a plurality of light emitting sections by grooves formed in the semiconductor structure layer. Each groove is defined by two opposite side faces of adjacent light emitting sections. Each side face has a recessed and protruding configuration. In one embodiment, the protrusions and recesses of one side face of one light emitting section fit in respective recesses and protrusions of a corresponding side face of an adjacent light emitting section.

20 Claims, 6 Drawing Sheets

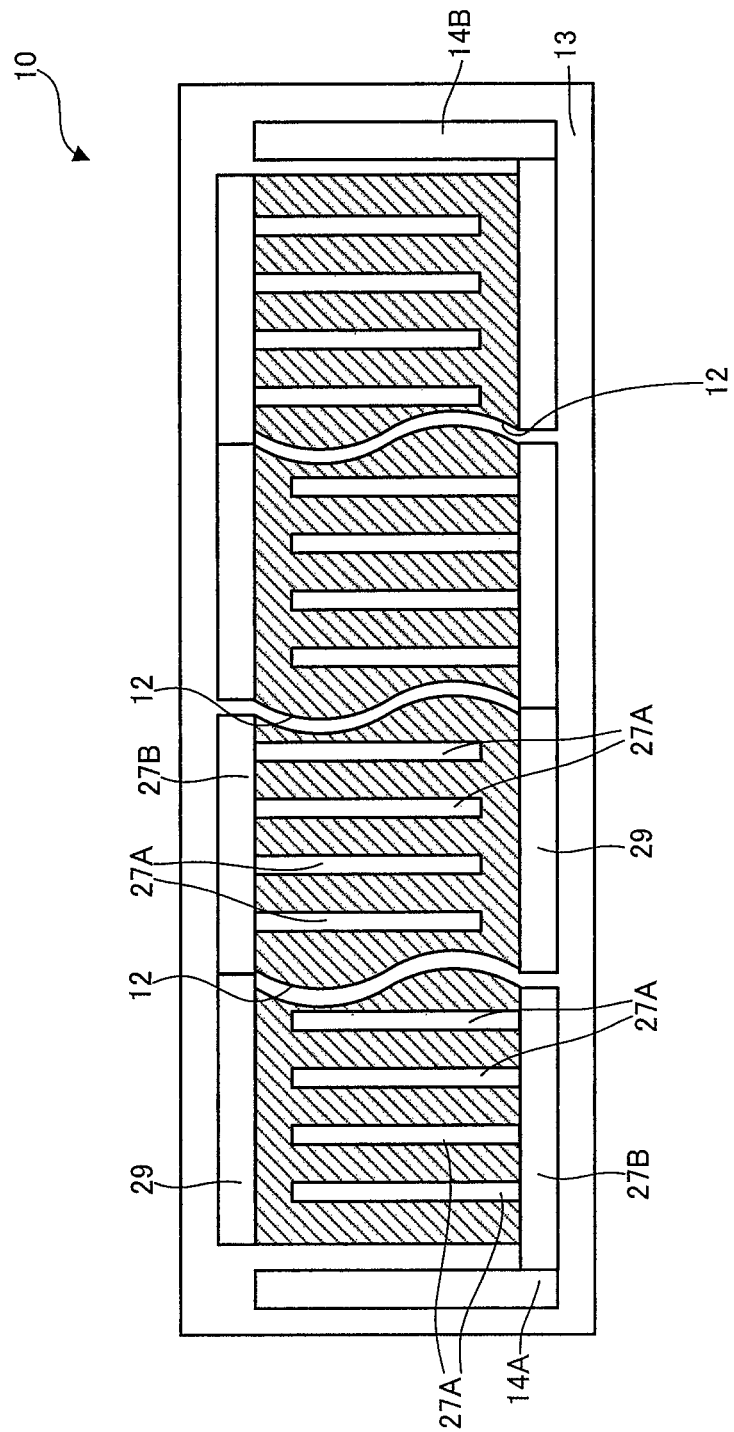

LED ARRAY

BACKGROUND OF THE INVENTION

1. Field of the Invention

The present invention generally relates to an array of light emitting elements such as light emitting diodes (LEDs), and also relates to an apparatus having such an array of light emitting elements.

2. Description of the Related Art

Light emitting apparatuses with LED elements provided therein are used for illumination, backlighting, and the like. In recent years, light emitting apparatuses are also used for automotive lamps such as headlights in automobiles. One example of such light emitting apparatuses is disclosed in Japanese Patent Application Kokai (Laid-open) No. 2006-48934. This light emitting apparatus has an LED array, and includes several LED elements arranged in series in order to ensure a needed luminous flux. Another example of light emitting apparatuses is disclosed in Japanese Patent Application Kokai No. 2006-80442. This light emitting apparatus is another LED array device that possesses a plurality of light emitting sections on one support substrate.

SUMMARY OF THE INVENTION

In the light emitting apparatus with the several LED elements as disclosed in Japanese Patent Application Kokai No. 2006-48934, an interval of about 100 μm (micrometers) is needed between adjacent LED elements in view of arrangement accuracy during mounting of the LED elements. Even in the LED array as described in Japanese Patent Application Kokai No. 2006-80442, an interval of about 30 μm is needed between the light emitting sections due to a limitation on patterning accuracy. No-light-emitting areas (i.e., gaps) extend linearly between the LED elements or between the light emitting sections. These straight no-light-emitting areas may make light emission from the LED array uneven. In particular, if the LED array is used for a lighting device such as automobile headlights, dark portions which are large enough to be visible may be formed on an illuminated surface.

An object of the present invention is to provide an LED array including a plurality of light emitting sections arranged therein that can increase the evenness of illuminance on a surface illuminated by the LED array.

Another object of the present invention is to provide a light emitting device having such LED array.

According to one aspect of the present invention, there is provided an LED array that includes a substrate and a semiconductor structure layer provided on the substrate. The semiconductor structure layer includes a first semiconductor layer of a first conductivity type formed on the substrate, an active layer formed on the first semiconductor layer, and a second semiconductor layer of a second conductivity type formed on the active layer. The semiconductor structure layer is divided into a plurality of light emitting sections by one or more groove portions formed in the semiconductor structure layer. The groove portions are defined by side faces (or side walls) of the light emitting sections. Opposite (or facing) side faces of adjacent light emitting sections each have a recessed and protruding configuration (or a concave and convex configuration). Thus, one side face of one light emitting section faces a corresponding side face of an adjacent light emitting section and these two side faces (i.e., a pair of recessed and protruding structures) define one groove portion. Such groove portion has a non-linear shape (e.g., wavy shape) when viewed from the top. The protruding portions of one side face of one light emitting section face the recessed portions of the corresponding side face of the neighboring light emitting section, and the recessed portions of the same side face of said one light emitting section face the protruding portions of the corresponding side face of said neighboring light emitting section. When a line is drawn connecting top points of the two protruding portions of said one side face of said one light emitting section, preferably the line contacts or intersects the protruding portion of the corresponding side face of said neighboring light emitting section. The depth of the groove portion may reach the top surface of the substrate, i.e., the groove portion may penetrate the second semiconductor layer, active layer and the first semiconductor layer.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 5 is a top view of an LED array according to another embodiment of the present invention.

DETAILED DESCRIPTION OF THE INVENTION

Figure 1A:
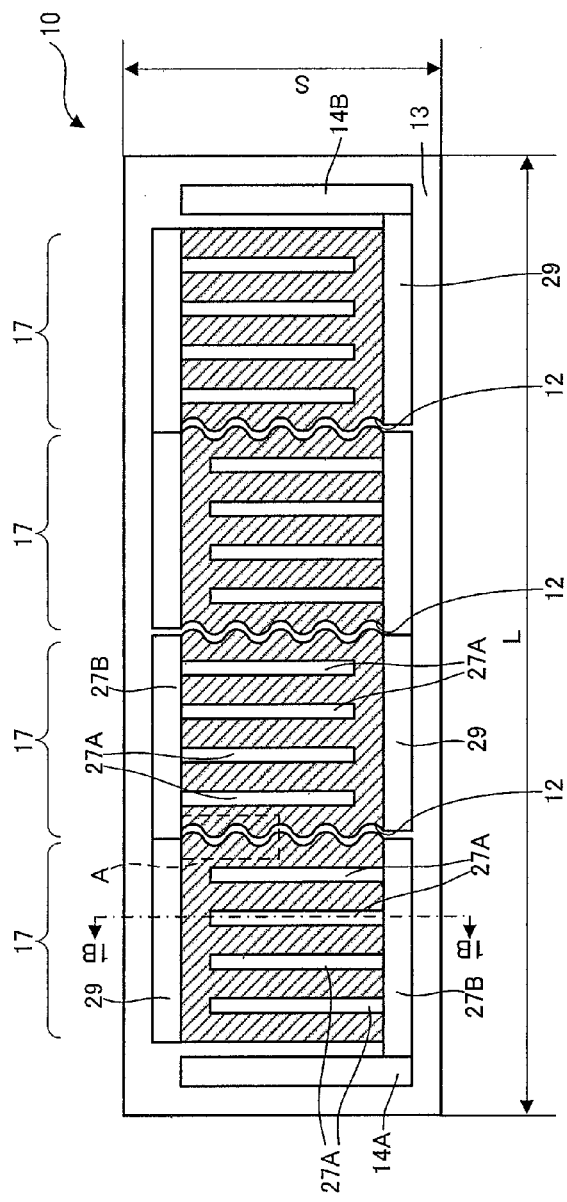
FIG. 1A is a top view of an LED array according to an embodiment of the present invention.

Now, an LED array 10 according to an embodiment of the present invention will be described with reference to FIG. 1A to FIG. 1C. The LED array 10 includes four LED elements 17 arranged on one support substrate 11 in series.

A support substrate 11 is formed of Si or the like having a high thermal conductivity. The support substrate 11 has an upper surface and a lower surface each having a rectangular shape. This rectangle has long sides L and short sides S. It should be noted that the support substrate 11 may be formed of any suitable material with a high thermal conductivity and a thermal expansion coefficient close to the thermal expansion coefficient of sapphire or GaN, which is used as a growth substrate on which a semiconductor structure layer is grown. Thus, AlN, Mo, W or CuW may be used for the support substrate 11.

If the support substrate 11 is conductive, an insulating layer 13 of an insulating material such as $SiO_2$ is formed on the support substrate 11. Feeding pads 14A and 14B and a first junction layer 15 are formed on the insulating layer 13. When the support substrate 11 is an insulating substrate, the feeding pads 14A and 14B and the first junction layer 15 may be formed directly on the support substrate 11 without the insulating layer 13.

The feeding pads 14A and 14B are feeding metal pads formed in respective edge areas along the short sides S of the support substrate 11. The first junction layer 15 is a metal layer such as AuSn layer which is joined, in a eutectic manner, with a second junction layer 19 in an LED element 17 disposed on the first junction layer 15, by thermocompression bonding during junction of the LED element 17 and the support substrate 11. The first junction layer 15 has an upper surface shape corresponding to the LED element 17 mounted on an upper surface of the first junction layer 15. Four first junction layers 15 are formed spacedly from one another in line in a direction of the long sides L. The upper surface of the first junction layer 15 is larger than a lower surface of the second junction layer 19 in the LED element 17 in the illustrated embodiment. It should be noted, however, that the upper surface of the first junction layer 15 may have the same shape as that of the lower surface of the second junction layer 19 of the LED element 17.

The four LED elements 17 are four light emitting sections of the LED array 10. The four LED elements 17 are arranged in series at regular intervals so that each of the LED elements 17 is located on the corresponding first junction layer 15. The LED element 17 is, for example, a substantial rectangular parallelepiped with an upper surface and a lower surface each having an approximately 1000 µm×1000 µm square shape. The LED element 17 has a recess-and-protrusion configuration (or concave-convex configuration) on a side face thereof opposite to one side face of an adjacent LED element 17. This side face of the adjacent LED element 17 has a corresponding recess-and-protrusion configuration. Each LED element 17 is formed by the second junction layer 19, a reflection electrode layer 21, a semiconductor structure layer 23, and an insulating film 25. The side face of the LED element 17 may be referred to as "side wall" of the LED element 17.

The second junction layer 19 is a metal layer such as AuSn provided on the first junction layer 15 and joined to the first junction layer 15 by eutectic junction. The second junction layer 19 has smaller upper and lower surfaces than the first junction layer 15.

The reflection electrode layer 21 is provided on the second junction layer 19. The reflection electrode layer 21 is formed of a metal such as Ni or Ag which is conductive with high optical reflectivity. The reflection electrode layer 21 has a function to reflect light from the semiconductor structure layer 23 in a light irradiation direction (emission direction).

The semiconductor structure layer 23 includes a p-type semiconductor layer 31 formed by a p-type GaN layer and a p-type AlGaN layer, an active layer 33, and an n-type semiconductor layer 35 formed by a strain relaxation layer containing GaN/InGaN, an nGaN layer, an undoped GaN layer, and a GaN buffer layer. The p-type semiconductor layer 31, the active layer 33, and the n-type semiconductor layer 35 are stacked in this order from the support substrate 11 side. The active layer 33 has a multiquantum well (MQW) structure in this embodiment, but alternatively the active layer 33 may have a single quantum well (SQW) structure or a single layer (so-called a bulk layer) structure.

The multiquantum well structure is formed by five pairs of well layers and barrier layers. The well layer is an $In_xGa_{1-x}N$ layer (composition x=0.35; thickness: 2 nm) and the barrier layer is a GaN layer (thickness: 14 nm). The In composition x of the well layer is adjusted within the range of $0 \leq x \leq 1.0$ according to a wavelength of the light from the LED element 17.

A cap layer (not shown in the drawings) of Ti and Pt is formed between the reflection electrode layer 21 and the second junction layer 19 to prevent Ag from migrating through the reflection electrode layer 21.

The insulating film 25 is formed of an insulating material such as $SiO_2$. The insulating film 25 covers side faces of the first junction layer 15, the second junction layer 19, the reflection electrode layer 21, and the semiconductor structure layer 23 and reaches an upper surface of the semiconductor structure layer 23. The insulating film 25 is formed so as to expose an upper surface of an n-type semiconductor layer 35 in the semiconductor structure layer 23, on which an n electrode 27 is formed, and to expose a surface of the first junction layer 15 in an area in which a p electrode 29 is formed.

Now, the shape of the LED element 17 will be described. As mentioned earlier, the LED array 10 has the four LED elements 17. The four LED elements 17 are partitioned by grooves 12. In the depth direction of the LED array 10, the grooves 12 penetrate the semiconductor structure layer 23, and extend downward to an upper surface of the insulating layer 13. Each LED element 17 has a periodic recess-and-protrusion structure on the side face thereof, and therefore one side face of one LED element 17 and a corresponding side face of adjacent LED element 17 define in combination each groove 12. Each groove 12 has a wavy shape, when viewed from the top.

Figure 1B:
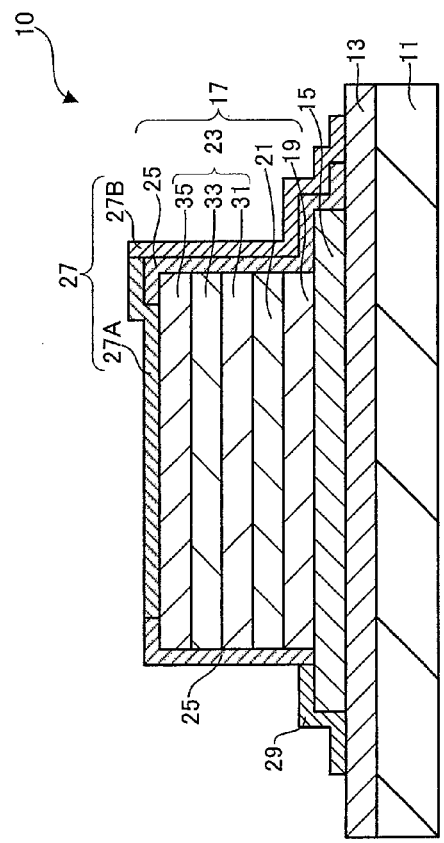
FIG. 1B is a cross-sectional view of the LED array in FIG. 1A taken along the line 1B-1B.
Figure 1C:
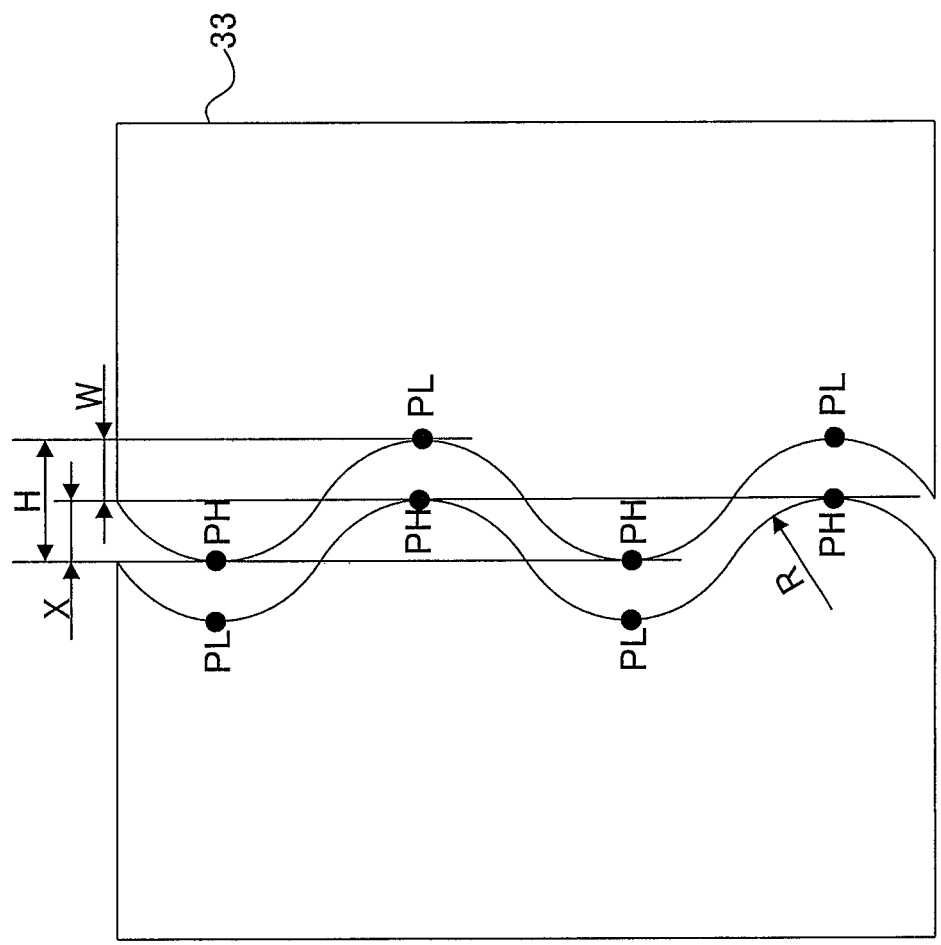
FIG. 1C is an enlarged horizontal cross-sectional view of a certain part of the LED array shown in FIG. 1A.

FIG. 1C shows a horizontal cross-sectional view of an area A enclosed by the broken line in FIG. 1A. More specifically, FIG. 1C shows an enlarged diagram of a cross section of the active layer 33 taken across a plane thereof parallel to an upper surface of the support substrate 11. Recesses and protrusions on the side surface of the LED element 17 generally have a curved wave shape consisting of a plurality of non-linear segments joined serially. Each non-linear segment has a radius R of 120 µm in this embodiment. A height H from a lower vertex PL of the recessed portion (valley portion) to an upper vertex PH of the protruding portion (peak portion) is 60 µm. An interval W between the side surfaces of the two adjacent LED elements 17 is 30 µm. The interval W is a width of the groove 12. A distance X between a line joining together the vertices PH of one side face of one LED element and a line joining together the vertices PH of the opposite side face of the neighboring LED element is 30 µm. Thus, each two adjacent LED elements 17 are formed and arranged such that the protruding portions of the side face of one LED element fit into the recesses of the side face of the other LED element, in other words, such that the line joining together the vertices PH of the protruding portions of the side face of one LED element penetrates the protruding portions of the side face of the other LED element. The curved wave shape between two adjacent active layers 33 shown in FIG. 1C is the same as the curved wave shape between two adjacent LED elements 17 shown in FIG. 1A.

Thus, by providing the opposite (or facing) side walls of the adjacent LED elements 17 with the recessed and protruding structure in which the side walls fit into each other, the gap between each two adjacent LED elements 17 does not extend linearly in the LED array 10 when viewed from the top. In other words, a no-light-emitting area 12 between each two adjacent LED elements 17 does not extend linearly in the LED array 10. The recess-and-protrusion configuration on the side walls of the LED elements 17 cause light obtained from the side walls of the LED elements 17 to be scattered (i.e., a direction of light is varied). This scattering decreases the unevenness of light emission from the LED array 10 and reduces (or eliminates) dark portions in the illuminated surface. In addition, the recess-and-protrusion configurations on the side walls of the LED elements 17 (i.e., wavy walls of the groove 12) reduce an amount of that light (this light is output by the active layers 33) which is totally reflected by the side walls of the LED elements 17. Accordingly, this increases an amount of light obtained from the side walls of the adjacent LED elements 17. In particular, an amount of light obtained from those parts of the side walls in which the active layers are not present increases. Thus, there is an increase in an amount of light obtained (extracted) from the grooves 12. As such, an amount of light from the no-light-emitting areas between the adjacent LED elements 17 increases, and the unevenness of light emission from the LED array 10 decreases. This reduces the dark portions on the illuminated surface. This in turn increases a total amount of light emission from the entire LED array 10.

Referring to FIGS. 1A and 1B, the n electrode 27 of each LED element 17 has four extraction electrodes 27A and one interconnect electrode 27B. The extraction electrodes 27A are arranged on that portion of the upper surface of the semiconductor structure layer 23 from which the n-type semiconductor layer 35 is exposed (FIG. 1B), at regular intervals like comb teeth in the direction of the long side L (FIG. 1A). The extraction electrodes 27A extend over the insulation film 25. The insulation film 25 extends along one of the long sides L of the LED element 17. The interconnect electrode 27B is formed on the insulating layer 13 and extends upward along one of the long side wall of the LED element 17 (FIG. 1B) such that the interconnect electrode 27B is electrically connected to the four extraction electrodes 27A (FIG. 1A). When viewed from the top, the interconnect electrode 27B extends along the log side L. The p electrode 29 is formed to cover the exposed portion of the first junction layer 15 (FIG. 1B) and extends along the long side L (FIG. 1A).

As shown in FIG. 1A, the n electrode 27 of the leftmost LED element 17 in the LED array 10 is connected to the feeding pad 14A, and the p electrode 29 of the rightmost LED element 17 is connected to the other feeding pad 14B. The p electrode 29 of each LED element 17 is electrically connected to the n electrode 27 of the adjacent LED element 17. That is, LED array 10 is configured such that the four LED elements 17 are electrically connected together in series.

A method for manufacturing the LED array 10 will be described with reference to FIG. 2A to FIG. 2D, FIG. 3A and FIG. 3B, and FIG. 4A to FIG. 4C which are all cross-sectional views taken along the line 1B-1B in FIG. 1. For clarification of illustration, the cross-sectional views of one LED array 10 will be described. In actuality, however, a plurality of LED arrays 10 may be simultaneously formed on one support substrate 11, and the support substrate may ultimately be divided into individual LED arrays 10 by dicing.

Figure 2A:
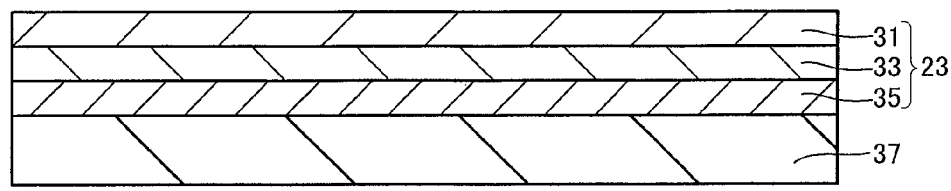
FIGS. 2A to 2D, FIGS. 3A to 3B and FIGS. 4A to 4C is a series of cross-sectional views depicting, in combination, a method for manufacturing the LED array shown in FIG. 1.

First, as shown in FIG. 2A, a semiconductor structure layer 23 of a nitride-containing semiconductor is formed on the (001) surface of a sapphire growth substrate 37 by an MOCVD method. The growth substrate 37 has a thickness of 430 μm and a diameter of 2 inches. The semiconductor structure layer 23 is obtained as follows. For example, first, the growth substrate 37 is put into an MOCVD apparatus, and the growth substrate 37 is thermally cleaned in the MOCVD apparatus. Then, a GaN buffer, an undoped GaN layer, a GaN layer doped with Si or the like and having a layer thickness of 5.0 μm, and a strain relaxation layer containing GaN/InGaN are sequentially grown in an epitaxial manner to form an n-type semiconductor layer 35. Then, an active layer 33 with a layer thickness of 75 nm is formed. On the active layer 33, sequentially grown are a p-type barrier layer with a composition $Al_{0.2}Ga_{0.8}N$ and a layer thickness of 40 nm and a GaN layer having a layer thickness of 100 nm. The GaN layer serves as a p-type clad layer. This growth proceeds in an epitaxial manner and forms a p-type semiconductor layer 31 on the active layer 33. The active layer 33 may be a multi-quantum well (MQW), a single quantum well (SQW), or a single layer (so-called a bulk layer).

The multiquantum well structure is formed by five pairs of well layer and barrier layer. The well layer is an $In_xGa_{1-x}N$ layer and its composition x is 0.35. The layer thickness of the well layer is 2 nm. The barrier layer is a GaN layer, and the layer thickness is 14 nm. The In composition x of the well layer is adjusted within the range of $0 \leq x \leq 1.0$ according to the emission wavelength of the LED element.

Figure 2B:
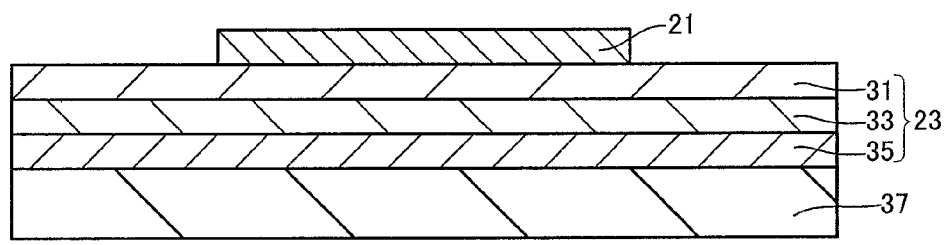

Then, as shown in FIG. 2B, a reflection electrode layer 21 of Ni and Ag is formed in that area on the p-type semiconductor layer 31 on which an individual LED element 17 will be formed. The reflection electrode layer 21 is formed on the p-type semiconductor layer 31 by, for example, sequentially depositing Ni to a layer thickness of 0.5 nm and Ag to a layer thickness of 300 nm by an EB deposition method. It should be noted that instead of the EB deposition method, a resistance heating deposition method, a sputtering method, or the like may be used. When making the reflection electrode layer 21, a resist mask may be formed on that part of the reflection electrode layer 21 on which the LED element 17 will be formed. Etching may then be carried out at 25° C. for 20 seconds using an etchant containing nitric acid, water, acetic acid and phosphoric acid mixed together in the ratio of 1:1:8:10. Subsequently, the resultant structure may be heated in an atmosphere containing oxygen at 400° C. for 2 minutes to form a reflection electrode layer 21 in that area where the individual LED element 17 will be formed.

In order to prevent Ag in the reflection electrode layer 21 from diffusing, a cap layer of Ti (layer thickness: 100 nm)/Pt (layer thickness: 200 nm) may be formed on the reflection electrode layer 21. The cap layer (not shown in the drawings) is a metal diffusion prevention barrier layer.

Figure 2C:
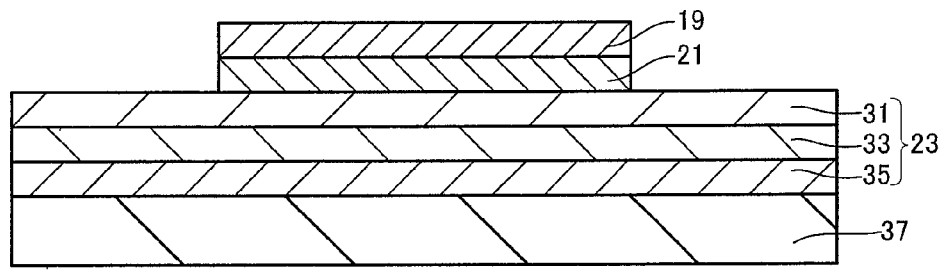

Then, as shown in FIG. 2C, a second junction layer 19 is formed on the cap layer (not shown). The second junction layer 19 is used for junction to the support substrate 11 (will be described). The second junction layer 19 is formed by sequentially depositing Ni as an under layer (layer thickness: 300 nm) and Au as an upper surface layer (layer thickness: 200 nm), for example, by the sputtering method.

Figure 2D:
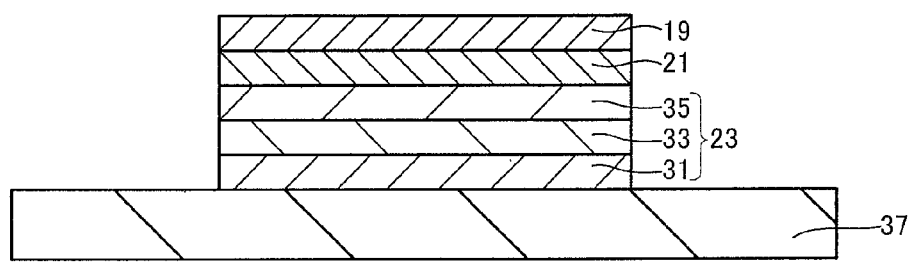

Then, as shown in FIG. 2D, the semiconductor structure layer 23 is etched by a dry etching method using a resist mask and chlorine gas to form individual LED elements 17. The etching is carried out such that one of the side faces of one LED element 17 which is opposite to an adjacent LED element 17 forms a wave shape in a cross section parallel to the upper surface of the support substrate 11. As described above with reference to FIG. 1C, the wave shape is formed by a plurality of curves joined together. Each curve has a radius R of 120 μm. The height H from the vertex PL of each recessed portion to the vertex PH of the protruding portion is 60 μm. The interval W between the side walls of the adjacent LED elements 17 (i.e., the width of the groove 12) is 30 μm. The distance X between the line joining together the vertices PH of one side face of one LED element and the line joining together the vertices PH of the corresponding side face of an adjacent LED element is 30 μm. Thus, after having been subjected to the etching, the adjacent LED elements 17 are shaped and arranged such that the protrusions of the side face of one LED element are spacedly received in the corresponding recesses of the corresponding side face of the other LED element. In other words, the line joining together the apexes PH of the side face of one LED element penetrates the protrusions on the side face of the other LED element. It should be noted that the width W of the groove 12 may be any value between 5 and 60 micrometers depending on given and/or desired conditions on the LED array 10.

Figure 3A:
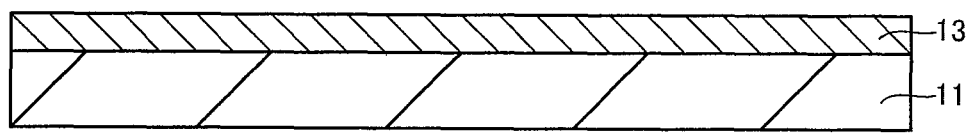

Then, as shown in FIG. 3A, a support substrate 11 formed of, for example, Si is prepared, and an insulating layer 13 is formed on the support substrate 11. The insulating layer 13 is formed by, for example, thermally oxidizing the surface of the Si support substrate 11 to provide an $SiO_2$ film. The thickness of the insulating layer 13 formed may be any suitable value that is enough to achieve an insulating function.

Figure 3B:
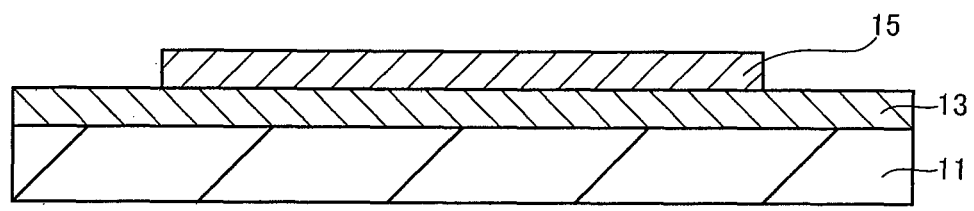

Then, as shown in FIG. 3B, a first junction layer 15 is formed in that area on the insulating layer 13 in which the LED element 17 will be formed. The first junction layer 15 is shaped identically to an upper surface of the LED element 17 except that the first junction layer 15 is wider than the upper surface of the LED element in a direction along the short side S. The first junction layer 15 can be, for example, formed in a desired area (an area with a shape corresponding to the LED element 17) using a liftoff method. If the liftoff method is employed, first, a photo resist is applied the entire surface of the insulating layer 13, and the substrate is prebaked in the atmosphere using a hot plate at a predetermined temperature. Then, the insulating layer 13 with the photo resist pattern is exposed using UV light. A reversal bake process is carried out on the exposed photo resist at 120° C. for about 90 seconds to subject the exposed portion to thermal crosslinking. Then, the entire surface of the photo resist is irradiated with UV light for reverse exposure. The photo resist is then immersed into a liquid developer to form a desired photo resist pattern (in the entire area of the insulating layer 13 other than the area in which the first junction layer 15 is formed).

Then, Ti (layer thickness: 150 nm), Ni (layer thickness: 50 nm), Au (layer thickness: 100 nm), Pt (layer thickness: 200 nm), and AuSn (layer thickness: 1000 nm; Sn content: 21 wt %) are stacked using a resistance heating deposition method to form a metal layer. Subsequently, the liftoff process is carried out to form a first junction layer 15. The Sn contained in the AuSn layer may allow the AuSn layer to be joined, in a eutectic manner, to Au of the second junction layer 19. The Sn content in the AuSn layer may be, for example, 18 to 23%. It should be noted that the first junction layer 15 may be formed in a desired area using a dry etching method or a wet etching method.

Figure 4A:
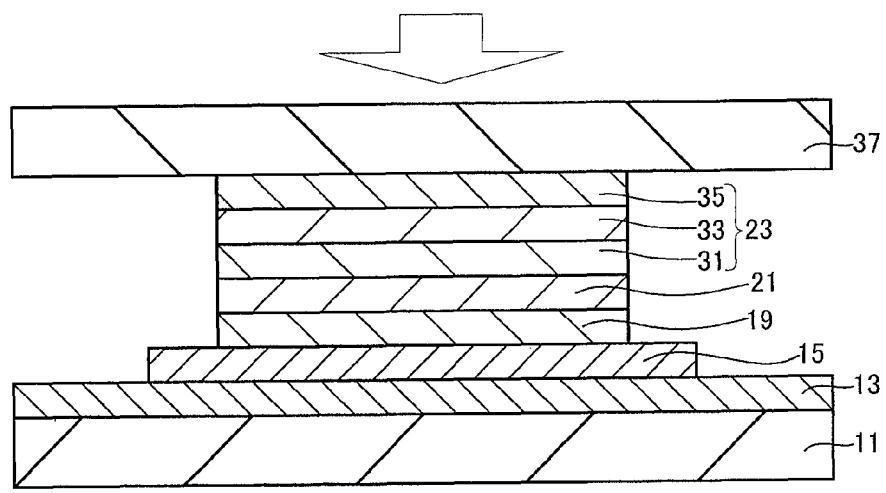

Then, as shown in FIG. 4A, a thermal press fitting junction process is carried out in a vacuum atmosphere or a nitrogen atmosphere. Specifically, the first junction layer 15 and the second junction layer 19 are brought into contact with each other in the vacuum or nitrogen atmosphere, and 6-kN forces are applied to the first junction layer 15 and the second junction layer 19 in the respective opposite directions as indicated by opposite unshaded arrows. With the forces kept applied, the first junction layer 15 and the second junction layer 19 are heated to and maintained at 330° C. for a predetermined time (about 10 minutes) to form the metals in the junction layers into a eutectic structure.

Then, for example, a laser liftoff (LLO) apparatus is used to irradiate a back face of the growth substrate 37 with excimer laser light to remove the growth substrate 37. It should be noted that the removal of the growth substrate 37 may not necessarily be carried out by the LLO apparatus. The removal of the growth substrate 37 may be carried out by wet etching, dry etching, mechanical polishing, chemical mechanical polishing (CMP), or a combination of at least two of these methods.

If the growth substrate 37 is removed by the LLO apparatus, then Ga resulting from the LLO process upon the removal of the growth substrate 37 is removed by hot water or the like, and the surface from which the growth substrate 37 has been removed is treated with hydrochloric acid. It should be noted that any suitable chemical (or agent) may be used for the surface treatment following the LLO process, provided that the chemical (or agent) allows a nitride semiconductor to be etched. For example, an acid such as phosphoric acid or sulfuric acid or an alkaline solution such as KOH or NaOH may be used. It should be also noted that the surface treatment may be carried out by dry etching using Ar plasma or chlorine plasma, polishing, or the like.

Figure 4B:
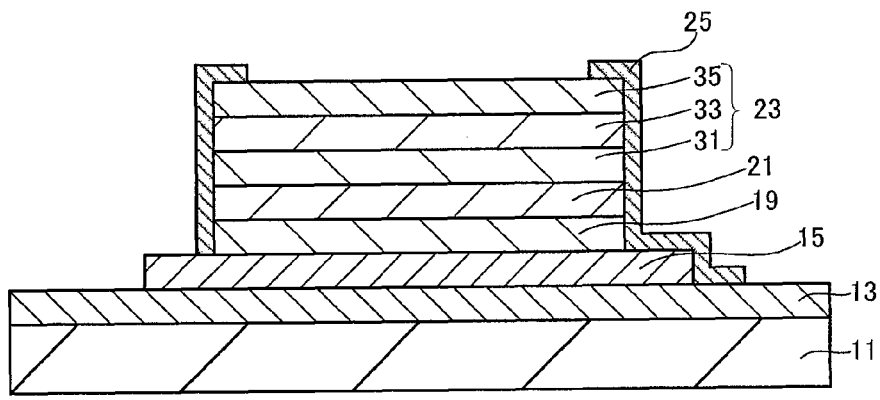
Figure 4C:
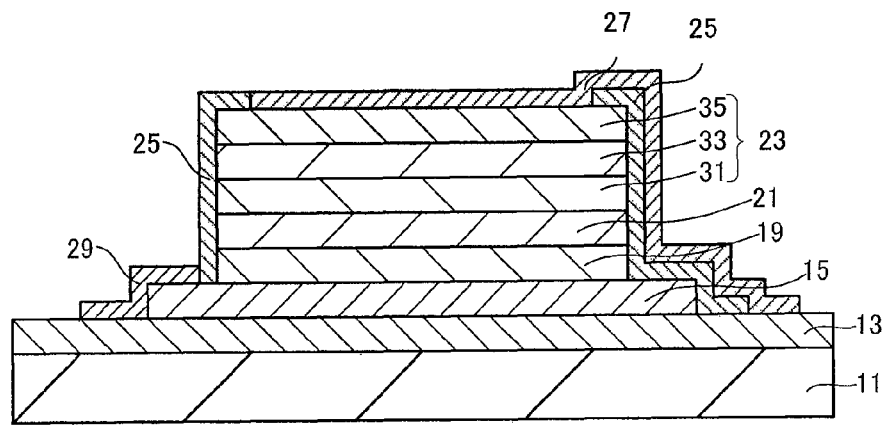

After the treatment is finished, an insulating film 25 is formed so as to cover side faces of the first junction layer 15, the second junction layer 19, and the semiconductor structure layer 23, as shown in FIG. 4B. Specifically, an insulating film of $SiO_2$ is formed by CVD or the like to a layer thickness of, for example, 600 nm all over the surfaces of the first junction layer 15, the second junction layer 19, and the semiconductor structure layer 23. Then, buffered hydrofluoric acid is used to etch away the insulating film on the upper surface of the semiconductor structure layer 23 and the insulating film on the area of the first junction layer on which the p electrode 29 is formed (i.e., one of rectangular areas of the first junction layer along the long side L of the support substrate 11). As a result, the insulating film 25 is formed.

Then, an electrode forming step is carried out as follows. A Ti layer with a film thickness of 1 nm, an Al layer with a thickness of 200 nm, a Ti layer With a film thickness of 100 nm, a Pt layer with a film thickness of 200 nm, and an Au layer with a film thickness of 1 μm are stacked by the electron beam deposition method and then patterned by the liftoff method or the like to form an n electrode 27 and a p electrode 29. Finally, the resulting structure is divided into chips by dicing to provide such LED arrays 10 as shown in FIG. 1A and FIG. 1B. During this electrode forming step, the p electrode 29 of one LED element may be integrated with the n electrode 27 of an adjacent LED element, and n electrode 27 of one LED element may be integrated with the p electrode 29 of an adjacent LED element. The n electrode 27 may be formed of any suitable material that can enable an ohmic junction to be formed with an n-type semiconductor. For example, the n electrode 27 may be formed using Al/Rh, Al/Pt, or the like.

It should be noted that after the electrode forming step, $SiO_2$ may be deposited over an entire upper surface of the LED array 10 to a thickness of 350 nm by sputtering so as to cover all the LED elements 17 to form a surface protect layer (not shown in the drawings), before the LED array 10 may be divided into chips.

In the LED array 10 of this embodiment, the recessed and protruding structures are formed on the respective opposite side faces of the adjacent LED elements such that the recesses and protrusions of one LED element fit into the corresponding protrusions and recesses of an adjacent LED element. Thus, in the surface (e.g., road surface) illuminated with the light from the LED array 10, a difference in illuminance between the darker portions generated by the no-light-emitting sections 12 of the LED array 10 and the other areas (brighter portion) generated by the light-emitting sections 17 of the LED array 10 can be reduced.

In the above-described embodiment, the side face of the LED element 17 has a wavy (or corrugated) shape having a periodic configuration. In other words, the side face of the LED element 17 has repetition of same recesses and same protrusions, i.e., the groove 12 has a regular wavy configuration when viewed from the top. It should be noted, however, that the LED element side face (or the groove 12) is not limited to this shape. The LED element side face may be configured such that in a cross section parallel to the upper surface of the support substrate 11 (i.e., when viewed from the top), a no-light-emitting area or groove 12 does not linearly extend between adjacent LED elements 17. For example, as shown in FIG. 5, the side face of the LED element 17 may only have a single recess and a single protrusion. This groove 12 can also be called a wavy configuration.

In the above-described embodiments, the side walls of the adjacent LED elements 17 are arranged to fit into each other so that the line joining together the vertices PH of the protruding portions of the side wall of one LED element 17 penetrates the protruding portions of the side wall of the adjacent LED element 17 (FIG. 1C). Alternatively, however, the side wall of the LED element 17 may be configured such that the line joining together the vertices PH of the protruding portions of the side wall of one LED element may contact the vertices of the protruding portions of the side wall of the adjacent LED element. The only requirement is that in a cross section parallel to the upper surface of the support substrate 11, a no-light-emitting area 12 does not extend linearly between the adjacent LED elements, provided that dark portions are less (or no longer) perceived in a surface illuminated by the LED array 10.

In the above-described embodiments, the recessed and protruding structure on the side face of the LED elements is periodic. However, the recessed and protruding structure may be aperiodic and/or irregular. For example, the numbers of recesses and protrusions on one side face of one LED element may be different from those on the other side face of the same LED element. Also, the horizontal cross-sectional shape of the LED element side face need not necessarily be a curved wave shape but may be a different shape. For example, the side face may have a rectangular wave shape, a triangular wave shape, or a saw-tooth wave shape.

In the above-described embodiments, only that side face of each LED element 17 which faces an adjacent LED element has a recessed and protruding structure. However, other side faces of the LED element 17 may also have a recessed and protruding structure. This further increases the amount of light that can be obtained from the side faces of the LED element 17. This in turn achieves a further increase in the amount of light emission from the entire LED array 10.

The foregoing description deals with the LED array 10 in which the semiconductor structure layer grown on the growth structure is re-stuck to the support structure. This is called a metal bonding LED array. However, the present invention is not limited to this configuration. For example, the present invention is applicable to another type of LED array that has individual LED elements defined by grooves in a semiconductor structure layer grown on a growth substrate.

In the above-described embodiments, the LED element 17 is rectangular in a vertical cross section (i.e., cross section perpendicular to the upper surface of the support substrate 11). However, the vertical cross section of the LED element 17 may have a different shape such as a trapezoid. In the above-described embodiments, the 1×4 LED array is described in which the four LED elements 17 are arranged in series, by way of example. However, the LED array may have another configuration such as 2×4 and 4×4.

In the above-described embodiments, the LED array 10 using the LED elements 17 is described by way of example. However, the present invention is applicable to a light emitting element array using other light emitting elements. It should also be noted that the numerical values, dimensions, materials, and the like in the above-described embodiments are only illustrative. The numerical values, dimensions, materials, and the like may be properly selected according to the application of the LED array, light emitting elements manufactured, and the like.

This application is based on Japanese Patent Application No. 2012-204631 filed on Sep. 18, 2012, and the entire disclosure thereof is incorporated herein by reference.

What is claimed is:

1. An LED array comprising:
   a substrate; and
   a semiconductor structure layer provided on the substrate, said semiconductor structure layer having a first semiconductor layer of a first conductivity type formed on the substrate, an active layer formed on the first semiconductor layer, and a second semiconductor layer of a second conductivity type formed on the active layer,
   the semiconductor structure layer having a plurality of light emitting sections, each of said light emitting sections having an LED element, said light emitting sections being partitioned by groove portions formed in the semiconductor structure layer, and
   said groove portions being defined by side faces of the light emitting sections such that one said groove portion is defined by two said side faces of two said light emitting sections disposed next to each other, each of said two side face having a recessed and protruding structure such that protrusions and recesses of one of said two side faces face recesses and protrusions of the other of said two side faces respectively and such that a segment joining together apexes of the protrusions of said one of said two side faces contacts or penetrates the protrusions of said the other of said two side faces.

2. The LED array according to claim 1, wherein the recessed and protruding structure has a periodic shape.

3. The LED array according to claim 1, wherein the recessed and protruding structure has a curved wave shape.

4. The LED array according to claim 1, wherein a recessed and protruding structure is formed also on other side faces of said two light emitting sections than said two side faces of said two light emitting sections.

5. The LED array according to claim 1, wherein the light emitting sections are arrayed in one or more lines on the substrate.

6. The LED array according to claim 1, wherein the recessed and protruding structure has an aperiodic shape.

7. The LED array according to claim 1, wherein each of the groove portions has an S shape.

8. The LED array according to claim 1, wherein each of the groove portions has a depth that reaches the first semiconductor layer from an upper surface of the second semiconductor layer.

9. The LED array according to claim 1, wherein each of the groove portions has a width of 5 to 60 micrometers.

10. A light emitting element array comprising:
    a substrate; and
    a semiconductor structure layer provided on the substrate, said semiconductor structure layer having a first semiconductor layer of a first conductivity type formed on the substrate, an active layer formed on the first semiconductor layer, and a second semiconductor layer of a second conductivity type formed on the active layer,
    the semiconductor structure layer having a plurality of light emitting sections, said light emitting sections being partitioned by groove portions formed in the semiconductor structure layer, each of said groove portions being defined by two side faces of two said light emitting sections disposed next to each other, each said groove portion having a non-linear configuration when viewed from a top of the semiconductor structure layer.

11. The light emitting element array according to claim 10, wherein the groove portion has a wavy shape when viewed from the top of the semiconductor structure layer.

12. The light emitting element array according to claim 11, wherein the wavy shape is a periodic shape.

13. The light emitting element array according to claim 10, wherein the non-linear configuration is formed also on other side faces of said two light emitting sections than said two side faces of said two light emitting sections.

14. The light emitting element array according to claim 10, wherein the light emitting sections are arrayed in one or more lines on the substrate.

15. The light emitting element array according to claim 10, wherein each of the groove portions has an aperiodic shape.

16. The light emitting element array according to claim 10, wherein each of the groove portions has an S shape.

17. The light emitting element array according to claim 10, wherein each of said light emitting sections includes a light-emitting diode.

18. The light emitting element array according to claim 10, wherein each of said two side face has a recessed and protruding structure such that protruding and recessed portions of one of said two side faces face recessed portions and protruding portions of the other of said two side faces respectively, and a segment joining together apexes of the protruding portions of said one of said two side faces contacts or penetrates the protruding portions of said the other of said two side faces.

19. The light emitting element array according to claim 10, wherein each of the groove portions has a width of 5 to 60 micrometers.

20. A light emitting apparatus including an LED array of claim 1.

* * * * *